United States Patent [19]
Maxfield et al.

[11] Patent Number: 5,120,707
[45] Date of Patent: Jun. 9, 1992

[54] SUPERCONDUCTING CERAMICS BY ELECTRODEPOSITION OF METALS WITH EMBEDMENT OF PARTICULATE MATTER, FOLLOWED BY OXIDATION

[75] Inventors: MacRae Maxfield, Plainfield; Helmut Eckhardt, Madison; Ray H. Baughman, Morris Plains; Zafar Iqbal, Morristown, all of N.J.

[73] Assignee: Allied-Signal, Inc., Morris Township, Morris County, N.J.

[21] Appl. No.: 355,611

[22] Filed: May 22, 1989

[51] Int. Cl.$^5$ .......................................... H01B 12/00
[52] U.S. Cl. ........................................ 205/1; 205/51
[58] Field of Search ................. 423/263; 204/16, 35.1

[56] References Cited

U.S. PATENT DOCUMENTS

| | | | |
|---|---|---|---|
| 4,108,737 | 8/1978 | Ehrhardt | 204/16 |
| 4,295,147 | 10/1981 | Kircher | 505/874 |
| 4,598,016 | 7/1986 | Thoma | 204/16 |
| 4,879,270 | 11/1989 | Maxfield | 505/1 |

FOREIGN PATENT DOCUMENTS 0289412 11/1988 European Pat. Off.

OTHER PUBLICATIONS

Williamson, W. O. "Strength and Microstructures of Dried Clay Mixtures" in: *Ceramic Processing Before Firing* (New York, John Wiley & Sons, 1978), pp. 378 and 396.

Johnston, D. C. "Variation in the Structural Magnetic and Superconducting Properties of $YBa_2Cu_3O_{7-x}$ with Oxygen Content" in: *Chemistry of High-Temperature Superconductors* (Wash., DC, American Chemical Society, 1987), pp. 136–137.

Zurawski, D. J. "Towards the Electrochemical Synthesis of High Temperature Superconductors," *Journal of Electrochemical Society* (Jun. 1988), pp. 1607–1608.

Pemsler, Dialog File No. 265/266 (Federal research in progress) (1988).

Appl. Phys. Lett 52, 2077, (1988) A. Gupta et al., "Superconducting Oxide Films with High Transition Temperature . . .".

Appl. Phys. Lett. 52, 2071, (1988), M. D. Kirk et al., "Scanning Tunneling Microscopy of the a-b planes of $Bi_2(Ca,Sr)_3Cu_2O_{8+\delta}$ Single Crystal . . .".

Appl. Phys. Lett. 52,2068, (1988), A. Mogro-Campero et al., "Characterization of Thin Films of Y-Ba-Cu-O on Oxidized Silicon . . .".

Appl. Phys. Lett. 52, 1992, (1988), B. T. Sullivan et al., "Bi-Sr-Ca-Cu-Oxide Superconducting Thin Films Deposited by dc Magnetron Sputtering".

Appl. Phys. Lett. 52, 1987, (1988), R. P. Gupta et al., "Y-Ba-Cu-O Superconducting Film on Oxidized Silicon".

Appl. Phys. Lett. 52, 1904, (1988), J. W. C. de Vries,

(List continued on next page.)

*Primary Examiner*—John F. Niebling
*Assistant Examiner*—Isabelle R. McAndrews
*Attorney, Agent, or Firm*—Gerhard H. Fuchs; Richard C. Stewart

[57] ABSTRACT

Superconducting ceramic layers are made by first electrochemically depositing metal layers containing embedded particulate matter, followed by oxidation of the precursor layer to form the desired superconducting ceramic. The embedded particulate matter may (a) furnish required constituent metals for the superconductor, (b) be a superconductor itself, which may be the same as or different from the superconductor to be formed, or (c) provide adjuvant substances for improving the properties (e.g., electrical or mechanical) of the superconducting layer being formed.

24 Claims, 6 Drawing Sheets

OTHER PUBLICATIONS

"Preparation, Patterning, and Properties of Thin $YBa_2Cu_3O_{7-\delta}$ Films".

J. Cryst. Growth, 85, 615 (1987), R. L. Henry et al., "Thin Film Growth of $YBa_2Cu_3O_x$ From Nitrate Solutions".

J. Cryst. Growth, 85, 619 (1987), A. S. Edelstein et al., "Formation of the Structure of the Superconducting Phase of La-Sr-Cu-O by dc Sputtering".

Appl. Phys. Lett. 51, 861 (1987), X. D. Wu et al., "Epitaxial Ordering of Oxide Superconductor Thin Films on (100) $SrTiO_3$ Prepared by . . . ".

Appl. Phys. Lett. 52, (1988), D. M. Hwang et al., "Transmission Electron Microscopy Studies of Superconducting Y-Ba-Cu-O Films Prepared by . . . ".

Ext. Abstracts, Mat. Res. Soc., Reno, NV, Apr. 5-9 (1988), D. W. Capone et al., "High Temperature Superconductors II".

Appl. Phys. Lett. 52, 1743 (1988), A. D. Berry et al., "Formation of High $T_c$ Superconducting Films by Organometallic Chemical Vapor Deposition".

Jap. J. Appl. Phys. 27, L1265 (1988), Nakamori et al., "Superconducting Y-Ba-Cu-O Oxide Films by OMCVD".

Jap. J. Appl. Phys. 27, L1275 (1988), Yamane et al., "$T_c$ of c-Axis-Oriented Y-Ba-Cu-O Films Prepared by CVD".

Appl. Phys. Lett. 53, 406 (1988), D. S. Ginley et al., "Sequential Electron Beam Evaporated Films of $Tl_2CaBa_2Cu_2O_y$ with Zero Resistance at 97 K".

SUPERCONDUCTING CERAMICS BY ELECTRODEPOSITION OF METALS WITH EMBEDMENT OF PARTICULATE MATTER, FOLLOWED BY OXIDATION

CROSS-REFERENCE TO RELATED APPLICATIONS

This application is related to commonly assigned, copending U.S. appl. Ser. Nos. 188,019 and 188,772, both filed Apr. 29, 1988; 335,242 filed Apr. 10, 1989; and 197,248, filed May 20, 1988.

BACKGROUND OF THE INVENTION

This invention relates to deposited layers of superconducting ceramics, including deposited thin layers and films of such superconductors.

Many of the suggested uses of the recently discovered ceramic superconducting compounds benefit from or require the application of the superconducting material in layers or thin films. These superconducting ceramics include superconductors in the systems represented by Ba-RE-Cu-O (wherein RE is one or more of La, Y, Sm, Eu, Gd, Tb, Dy, Ho, Er, Tm, Yb, Lu or Th); La-M-Cu-O (wherein M is Sr, Ba or Ca); Bi-Sr-Ca-Cu-O; and Tl-Ba-Ca-Cu-O. Suggested uses include flexible electrical conductors for transmission of electricity and for motor, generator, magnetic windings and superconducting elements for microelectronic circuits. This invention provides a new method for making such superconducting ceramics in relatively thin layers and thin films. In another respect, this invention provides ceramic superconducting layers or films which incorporate particulate matter to impart improved properties, such as, for example, whiskers or fibers for improved electrical or mechanical properties, or other superconducting ceramics for improved conductive properties.

SUMMARY OF THE INVENTION

In a broad aspect, the invention provides a method for forming superconducting ceramics which involves, as a first step electrochemically depositing, onto a substrate, at least one of the constituent metals required for forming the superconducting ceramic, and embedding particles of adjuvant matter into the metal as it is being deposited, to form a precursor deposit of electrochemically deposited metal containing embedded particulate matter, wherein the constituent metals required for forming the superconducting ceramic are provided, in proportions sufficient to form the superconducting ceramic, from the electrochemically deposited metal alone or in combination with either one or both of the substrate and the particulate matter; and then, in a second step oxidizing the precursor deposit under conditions such that the desired superconducting ceramic is formed.

More particularly stated, the invention method involves the steps of:

first forming a precursor deposit by (a) electrochemically depositing, onto a substrate, at least one of the constituent metals of the desired superconducting ceramic, and (b) embedding particulate matter into the metal as it is being electrochemically deposited, wherein the particulate matter is being comprised of material selected from the group consisting of (i) components which provide constituent metal for the desired superconducting ceramic, selected from the group consisting of metals, metal oxides, metal alloys and compounds which are thermally reactable to form metal oxides;

(ii) superconductor ceramics, which may be the same or different from the superconducting ceramic to be formed; and (iii) adjuvant substances selected from the group consisting of metals other than constituent metals of the superconducting ceramic, metal filaments, and reinforcing fibers;

wherein, if less than all of the metals required for formation of the desired superconducting ceramic are electrochemically deposited, then the remaining constituent metal is supplied by either one or both of the particulate matter and the substrate, and wherein the metals are provided in proportions sufficient to form the superconducting ceramic; followed by heating the precursor deposit under oxidizing conditions sufficient to result in the superconducting ceramic.

The term "electrochemical deposition", as used herein refers to forming of metal deposit by discharging positive metal ions in an electrolyte to their neutral oxidation state at an electrode such that (1) the positive charge released in the discharge leaves through the electrode (cathode), and (2) the discharged metal species, being insoluble in the electrolyte, form a condensed coating on the electrode surface. According to this definition, there is a quantitative relation between the amount of charge being passed and the amount of metal species being deposited. By contrast, electrophoretic deposition, which does not involve a change in oxidation state of the depositing particles, exhibits no quantitative relation between the amount of charge passed and the amount of material deposited. The term "embedding particulate matter into the metal as it is electrochemically deposited" refers to adhering of particles to a matrix formed by the electrochemically deposited metals and the close surrounding of these particles by additional electrochemically deposited metals. Relative proportions of embedded particles to electrochemically deposited metals are not implied by this use.

It is to be understood that the material provided by the embedded particulate matter may supply a complete or partial deficiency in the amount of a constituent metal that is being electrochemically deposited. For example, for a superconducting composition including barium as a constituent metal, barium oxide or carbonate may be embedded in an electrochemically deposited metal layer which is devoid of barium, or which contains less than the total amount of barium required.

In addition to supplying one or more of the metals which are not being supplied by electrochemical deposition, or supplying particulate superconducting ceramic—which, as stated, may be the same or different from the superconducting ceramic being formed in the final oxidation step—the particulate matter may further optionally supply adjuvant substances such as (a) metals for improving superconducting performance (but which are not a constituent part of the superconducting ceramic) as, for example, silver or other noble metals; (b) metal filaments coated with silver or other noble metals, to enhance normal state conducting properties while at the same time providing reinforcement; (c) high strength ceramic fibers for reinforcement, for example, fibers or whiskers of silicon carbide, boron carbide, tungsten nitride, and boron nitride; (d) ceramics useful for enhancing epitaxy; or (e) essentially inert materials for achieving other desired modifications of the deposited superconducting ceramic, as for example, glass spheres for controlling density The operation of electrochemically depositing the metal may involve co-deposition of all of the required metal constituents for the desired superconducting ceramics in a single step from a mixed electrolyte containing all of the metal constituents, as described in our commonly assigned co-pending U.S. appl. Ser. No. 188,772, filed Apr. 29, 1988, or one or more of the metal components may be sequentially deposited in individual layers, and interdiffusion of the metals is affected by thermal treatment, optionally in the final oxidation step, as is described in or commonly assigned, co-pending U.S. appl. Ser. No. 335,242, filed Apr. 10, 1989.

The means by which the particulate matter is embedded in the metal as it is being electrochemically deposited is not crucial. Conveniently, the particulate matter may be dispersed in the electrolyte, and it is then codeposited by means such as electrophoresis (if the particles carry an appropriate charge), or by mere mechanical inclusion as a result of being present at the point of electrodeposition. Embedment may be aided by providing agitation, or by sedimentation, which may be the result of gravity or centrifugal force.

In situations where the embedded particulate matter furnishes all or part of the required amount of a constituent metal, the particulate matter may be formed in situ by the expedient of electrochemically depositing the constituent metal in question under conditions such that some or all of it is being oxidized in the electrodeposition process. Under these circumstances, the metal oxide or oxides may be formed in situ, to be embedded into the electrochemically deposited layer as it is being formed. Such oxidation of one or more of the deposited metals may occur as the result of reaction with water, oxygen, peroxide or other oxidant dissolved in the electrolyte. Under such conditions, metal hydroxides may also be formed and embedded in the metal layer. Exemplary particulate matter arising from in situ formation include $Bi_2O_3$, $PbO_2$, and $Sr(OH)_2$. In general, precursor metal layers having such metal oxide inclusions convert readily into superconductor ceramics, and, if they remain highly conductive during the deposition process, are formed with desired thickness and structure.

Suitable substrates for forming the superconducting ceramics in accordance with the invention include any and all electrically conducting solids which do not adversely interact with any of the components of the precursors deposit or of the desired superconducting ceramics. They need not necessarily be inert, but instead may furnish a necessary element of the desired superconductor composition. For example, a copper substrate may supply required copper oxide. In general, suitable substrates include metals, such as Cu, Ag, Au, Pt, Ni; metal-coated ceramics, e.g. Cu-coated $Al_2O_3$ or Ag-coated MgO; semi-conductors such as SnO or InO; and the like.

The deposit being formed by the invention method may cover the substrate surface without discrimination as to the area being covered, or it may be a patterned deposit. By this latter-expedient it is possible to provide electrical circuits, parallel arrays of superconducting wire, dots on substrates to serve as shields for electromagnetic radiation, and the like. Electrical circuits and other objects containing semiconductors, insulator or conductor elements with superconducting elements may be formed by employing the above described method in conjunction with lithographic or photolithographic procedures, or in conjunction with photoenhanced electrodeposition. For applications in which high spatial resolution is not required, patterned superconductor films can be obtained by means of employing patterned counterelectrodes in the electrodeposition process.

Additionally, in the superconducting ceramic deposit made by the invention method, crystallite orientation may be introduced in order to increase the critical current density. Crystallite orientation may be achieved by various means to be described in more detail, below, and as described in commonly assigned copending U.S. appl. Ser. No. 197,248 filed May 20, 1988.

A principal advantage of the invention method is that it combines compositional and phase control, easily accomplished in preparation of the particulate component, with film continuity, low contamination, and applicability to all film geometries and sizes, afforded by electrodeposition techniques. This feature constitutes advantage over various techniques known for producing superconductors, e.g., (a) bulk ceramic techniques which lead to high compositional and phase purity, but low critical currents; (b) sol-gel or metallo-organic techniques which are widely applicable, but have modest critical current values owing, possibly, to contamination; and (c) electrophoresis techniques which do not ensure electrical connectivity across particle boundaries.

The invention method is rapid compared to vacuum techniques, and facilitates formation of thick films which may be useful in power transmission. It provides the opportunity to incorporate additives, either as particles or as codeposited metals, which enhance properties, such as normal state conductivity, critical current, and mechanical strength Incorporation of superconductor phases that are difficult to prepare in film form by precursor routes is facilitated and more than one superconductor composition or phase are readily incorporated in a single film.

BRIEF DESCRIPTION OF THE DRAWINGS

Having briefly described the invention, the same may be better understood from the detailed description to follow, in conjunction with the annexed drawings, wherein

FIG. 3($a$) is an x-ray diffraction (XRD) pattern of the deposited precursor film of Example I consisting of preformed particles of $Bi_2Sr_2CaCu_2O_8$ and electrochemically deposited Bi-Pb-Sr-Ca-Cu. The pattern is consistent with randomly oriented crystallites of $Bi_2Sr_2CaCu_2O_8$ as indicated by the reference pattern (b);

FIG. 4($a$) is an XRD pattern of the film of Example I after thermal oxidation, exhibiting the pattern of highly oriented $Bi_2Sr_2CaCu_2O_8$ with the c-axis perpendicular to the substrate surface (b, c, and d) are reference patterns of $Bi_2Sr_2CuO_6$, $Bi_2Sr_2CaCu_2O_8$, and Ag;

DETAILED DESCRIPTION OF THE INVENTION, OF THE PREFERRED EMBODIMENTS, AND OF THE BEST MODE PRESENTLY CONTEMPLATED FOR ITS PRACTICE

The electrochemical metal deposition may furnish all or less than all of the required metal constituents of the desired superconductor. Even though all of them may be furnished by the deposition process, still one or more of them may be furnished in amount insufficient to form the desired superconducting ceramic. If less than all of the required constituents are electrochemically provided or present as a substrate constituent, and/or if less than the total required amount is provided, then the particulate matter which is embedded in the electrochemically deposited precursor layer furnishes the deficiency.

Figure 1:
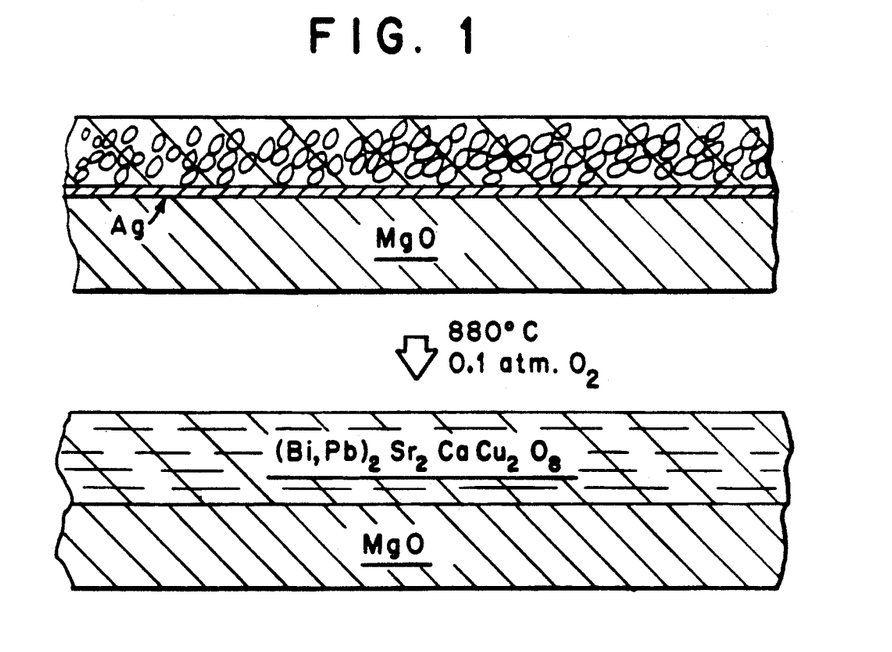
FIG. 1 is a schematic cross-sectional view of a Bulk Deposited (all required metal constituents electrochemically codeposited) precursor layer, before final oxidation to the superconducting phase, containing embedded particulate matter.
Figure 2:
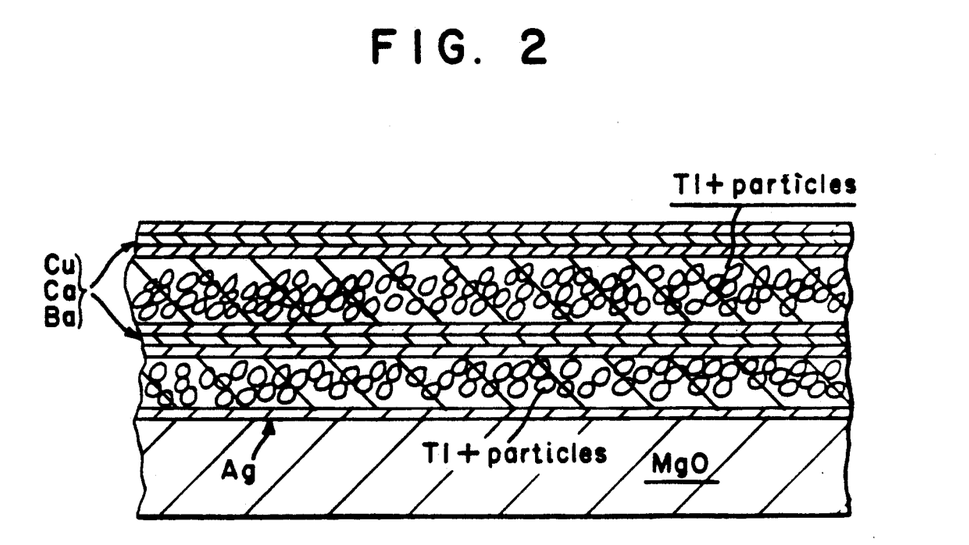
FIG. 2 is a schematic cross-sectional view of a Sequentially Deposited (required metal constituents sequentially deposited in separate layers, wherein only one of the metal layers contains the embedded particulate matter, e.g., a precursor layer for Tl-Ba-Ca-Cu-O superconducting film, consisting of two sequences of (1) Tl metal codeposited with embedded particles, and individually deposited layers of Ba, Ca, and Cu metals.

The electrochemical metal deposition may be conducted such that at least two, and possibly all of the required metal constituents are simultaneously deposited from a single mixed electrolyte containing the metal ions of the metals being deposited ("Bulk Deposition", see FIG. 1). It is also possible to build up the precursor layer by sequentially depositing individual layers of the constituent metals, to form a layered precursor structure ("Sequential Deposition", see FIG. 2), which is subsequently oxidized—suitably by heating in an oxidizing environment—to effect interdiffusion of the metal layers and formation of the desired superconducting ceramic. In either case, Bulk Deposition or Sequential Deposition, the electrochemical deposition operation may furnish all or less than all or insufficient amounts of the required constituent metals, and the deficiency, if any, is supplied by the embedded particulate matter or the substrate. Also, in Sequential Deposition, the particulate matter may be embedded in any one or more of the deposited individual layers. Whether the process employs Bulk Deposition or Sequential Deposition, and regardless of whether the electrochemical deposition process furnishes all or less than all or insufficient amounts of the required constituent metals, the deposit being formed may cover the substrate without discrimination as to the area being covered, or it may be a patterned deposit. As a variant of Bulk Deposition, it is possible to electrochemically deposit only one of the required metal constituents, as a single layer, and supply the deficiency by the embedded particulate matter and/or the substrate.

In the electrochemical deposition step a reducing potential is applied to a conductive substrate while it is in contact with an appropriate electrolyte into which is immersed a counter-electrode and, in some cases, other auxiliary electrodes.

In particular, the electrochemical Bulk Deposition can be conducted from an electrolyte containing salts of all of the metals in the mixture of metals to be deposited. Alternatively, one or more of these metals can be supplied by the particulate matter, by the substrate, or be included in the composition of the counterelectrode. Metals deposited from the electrolyte by Bulk Deposition or Sequential Deposition may include, but are not restricted to M=La, Y, Sm, Eu, Gd, Tb, Dy, Ho, Er, Nd, Ce, Tm, Yb, Lu, Th, Ba, Bi, Pb, Tl, Sr, Ca, and Cu, in combination and quantities sufficient to form superconducting ceramics by oxidation. The preferred specific metals and specific proportions of these metals in the superconducting oxides are the known superconducting ceramics described in the prior art. Of course, other metals which functionally behave in the same manner can be substituted for the above as will be readily apparent to those of ordinary skill in this art. In addition, other elements, which do not comprise part of a superconducting ceramic, may be electrochemically codeposited for purposes such as imparting enhanced mechanical properties. Preferred elements for electrochemical codeposition to impart improved mechanical properties are ceramic fibers and metals, such as silver, which do not substantially oxidize during formation of the superconductor.

Unless expressly stated otherwise, the discussion of the electrochemical deposition herein refers to Bulk Deposition and Sequential Deposition alike.

The electrolyte contains dissolved salts of the metal to be electrochemically deposited. Examples of such salts include $Y(NO_3)_3$, $Ba(PF_6)_2$, $Y(OC_3H_7)_3$, $Cu(OCOCH_3)_2$, $Bi(NO_3)_3$, $Pb(BF_4)_2$, $Tl(NO_3)_3$, $Tl(NO_3)$, $Sr(NO_3)_2$, $Ca(NO_3)_2$, $Pb(NO_3)_2$, $Cu(NO_3)_2$, $Eu(NO_3)_3$, $Ce(NO_3)_3$, and $Ba(NO_3)_2$, and the like, as well as the corresponding alkoxides.

For metals which cannot be electrochemically deposited from an aqueous medium, the electrolyte medium containing the salts is desirably an aprotic liquid, i.e., a liquid containing minimal acidic protons, such as dimethylsulfoxide (DMSO), dimethylformamide (DMF), dimethoxyethane (DME), tetrahydrofuran (THF), 2-methyl tetrahydrofuran (MTHF) and the like. Desirably, the nitrate salts of the metals are used in DMSO, and the alkoxide salts are used in the others, such as DMF, DME, THF and MTHF. The electrolyte media may in addition contain wetting, complexing, or other agents that impart control over composition, uniformity or morphology of the deposit. When the electrolyte medium is an aprotic liquid, some water may also be included in the electrolyte solution in order to achieve in some instances the desired conductivity and solubility of the given salt, or to form particulate matter in situ. Ordinarily, the water content would not be allowed to exceed that which would be coordinated with the dissolved ions. Water content equivalent to that arising from coordinated waters from dissolved salts is sufficient to convert some electrodeposited metals to their oxides or hydroxides. Such liquids with minimal or no water are referred to as aprotic liquids. While many of the metal constituents of ceramic superconductors would require electrochemical deposition from aprotic electrolyte media, some, such as Cu are advantageously deposited from aqueous media because of the advantages of higher possible current density, avoidance of possible organic contamination, lower cost electrolyte and reduced waste stream disposal difficulties.

The potential applied to the substrate should be sufficient to reduce cations of each salt in the electrolyte to the neutral oxidation state. It should, therefore, be sufficiently cathodic (i.e., at a suitably reducing potential) to reduce the cation having the most negative reduction potential of the mixture. For example, codeposition from an electrolyte containing salts of Eu, Ba, and Cu requires the application of a potential more negative than $-2.89$ V versus normal hydrogen electrode in order to reduce Ba($+2$) to Ba(0) (standard reduction potential $-2.89$ V) as well as Cu($+2$) to Cu(0) ($+0.34$ V), and Eu($+3$) to Eu(0) ($-2.37$ v). The applied potential may be varied with time, pulsed, or periodically reversed in order to regulate deposition current, electrolyte composition, and deposit nucleation. A potential of from about $-2$ V to about $-40$ V may suitably be employed The metal constituents are electrochemically deposited onto an electrically conductive substrate which is not degraded in the thermal treatment step. The substrate should be generally inert to reaction with the superconductor or superconductor precursor, except in the event that the substrate is to furnish one of the constituent elements of the desired superconductor, as discussed infra. Substrates that are reactive with either the superconductor or precursor may, if desired, be overlaid with a barrier layer (for example, by the initial step(s) of the Sequential Deposition process). Suitable substrate materials include metals (e.g., Ag, Au, Ni), metal-coated ceramics (e.g., Cu-coated $Al_2O_3$; Ag-coated MgO), and semiconductors (e.g., SnO,InO).

The substrate may be free standing such as conductive plates, rods, wires, fibers, and foils, or supported by structural material such as conductive thin films of metals, conductive oxides, and semiconductors coated on ceramics. The electrode substrates may be virtually any size, shape, and number as long as the electrolyte in contact with the surfaces to be coated is also in contact with a counter electrode. The electrode substrate can consist of or include a metal or metal-containing composition which reacts with the electrodeposited metal during oxidation to form the superconductor. For some applications it is desirable to utilize the electrode substrate as the sole source of one of the metals required for formation of the superconductor. This requires interdiffusion of substrate and deposited metals. For purposes of such interdiffusion, post-deposition thermal annealing is useful. A preferred example is electrodeposition of all the metals in the superconductor except for copper onto a low denier copper wire or thin copper foil. Oxidation of the substrate containing electrodeposited metals then yields the superconductor in wire or foil form.

The counter electrode and other auxiliary electrodes useful in this method are electrically conductive solids such as metals, semiconductors, and photoconductors. They may be inert or electroactive under the conditions of electrodeposition. Those that are electroactive may be useful as sources to the electrolyte of cations of metals being deposited. Counter electrodes with high electrical conductivities (above 100 S/cm) are preferred in order to minimize resistive energy losses during electroplating.

The electrodeposition of the metal mixtures may be performed in seconds or last up to several hours, depending on the deposition current which may range from about $10^{-3}$ to about $10^{+3}$ $mA/cm^2$ of substrate area. The preferred current for deposition from aprotic liquid electrolytes is from about $10^{-2}$ to about 10 $mA/cm^2$. The film thickness may range from about $10^{-2}$ to about $10^{+3}$ micron or more. The preferred film thickness range from about $10^{-1}$ to about 100 microns. Electrodeposition of precursor metal mixtures must be conducted at temperatures at which the electrolyte is ionically conductive. Electrodeposition in aprotic liquid electrolytes generally is conducted at temperatures between about $-40°$, and about $+200°$ C., the preferred temperature ranging from about 0° to about 100° C.

In Bulk Deposition, the composition of the electrochemically deposited material is generally determined by the deposition currents of the individual species at a given applied potential, the relative salt concentrations in the electrolyte, and the total salt concentration. In the case of aprotic liquid electrolytes, the applied potential should be sufficient to deposit all desired species, but it should not be so highly cathodic as to harm the deposit through decomposition of the electrolyte. Therefore, relative deposition currents of the individual species, which may differ greatly for a given mixture, are similarly restricted. In addition, total salt concentration is restricted by solubility limitations in any given electrolyte medium. Adjustments to electrolyte salt concentration are a means for obtaining desired deposit compositions. Near saturation of selected salts can be achieved by supplying excess salt to the cell. For any desired deposit composition, the required electrolyte salt concentration and the relative concentration of the individual dissolved species can be determined by those skilled in the art without undue experimentation. For example, at an applied potential of $-5$ V (vs. Ag/Ag+) and a total salt concentration of 0.1 M in DMSO, Y-Ba-Cu in the deposit varied according to relative cation concentrations as follows:

| Composite | | | Electrolyte | | |
|---|---|---|---|---|---|
| Y | Ba | Cu | $Y^{+3}$ | $Ba^+$ | $Cu^{+2}$ |
| 1 | 1.1 | 9.7 | 1 | 2 | 1 |
| 1 | 1.4 | 3.1 | 1 | 2 | 0.5 |
| 1 | 1.8 | 3.4 | 1 | 2.8 | 0.5 |

For the Sequential Deposition procedure, the electrolyte solvent will ordinarily also be an aprotic, non-aqueous solvent because non-noble metals, such as Ba, Ca, and Sr react with water and other protic media. Such metals can neither be deposited from protic electrolytes, nor exposed to protic media during the deposition of more noble metals. Thus, non-noble metals would have to be overlaid by a more noble metal, e.g., Bi, Cu, Pb, and Tl deposited from an aprotic electrolyte before using an aqueous electrolyte to apply a subsequent layer. Aside from this constraint, these and other more noble metals, which are useful as normal conductors and mechanical reinforcements (e.g., Au, Ag, and Ni), can be plated from aqueous electrolytes.

The potential applied to a cathode may be varied with time in order to alter the deposit without changing the electrolyte or other electrolysis conditions. In mixed-salt electrolytes, the composition of the depositing species can be modulated by varying the potential between values that are sufficient to reduce all of the cation species present in the electrolyte, and values that are sufficient to deposit the more noble metals but not the less noble metals. Thus, the sequence of layers can include multiple layers formed from a single electrolyte. Pulsing the potential between two or more values may also be effective in forming smaller grains in the deposit structure by enhancing deposit nucleation.

A more noble metal such as copper can be deposited on an electroplated layer of a less noble metal, such as barium, without current flow. Such metal atom interchange results from the thermodynamically driven exchange of a metal having a highly reductive reduction potential (e.g., $Ba^{+2}$ at $-2.9$ V vs. normal hydrogen electrode) with a metal having a more positive reduction potential (e.g., copper at $+0.34$ V).

The amount of material deposited in a layer can initially be determined by direct measurement, e.g., weight uptake, for each electrolyte. It can also be calculated by the equation $$M=(Q\times r)/z$$

where Q is the charge passed (total moles of electrons), z is the cation valency (moles of electrons per moles of cations), and r is the deposition efficiency for the electrolyte (moles of electrons involved in deposition per total moles of electrons Passed). Under ambient conditions, 0.2 M solutions in DMSO exhibit efficiencies as follows: Cu - 1, Bi - 1, Pb - 1, Ca - 0.92, Sr - 0.81.

In principle, in Sequential Deposition there is neither a lower nor an upper limit to the thickness of the individual layers, except that a layer must be (a) thick enough to provide even coverage over the deposited surface, and (b) thin enough to allow the constituents of the superconductor to interdiffuse through the thickness of a complete sequence of layers. The former criterion, whereby the scale of irregularities in the deposit does not exceed the diffusion distance of the deposited metal(s) during thermal processing, depends largely on the substrate, the type of deposit formed and the electrodeposition conditions. For example, very thin uniform layers may be obtained provided that the deposited species forms with a dense structure; the substrate has high conductivity and simple geometry; the cation has high mobility; and the electrolyte does not substantially react with the deposit. The latter criterion depends, largely, on the combination of deposited species and resulting superconductor. All layers may be very thick, provided that either all the metals readily interdiffuse or that the combined deposit (or its oxide) melt during the thermal oxidation step. An individual layer may be thick provided that the constituent metal diffuses readily throughout the other components of superconductor oxide.

The practical range of the thickness of the individually deposited layer in each individual electrodeposition step in Sequential Deposition is from about 0.01 micron to about 10 micron (about 0.00001 to about 0.01 mm). The preferred range is from about 0.05 micron to about 1 micron.

In Sequential Deposition, the minimum overall thickness of the layered deposit prior to the thermal treatment is dictated by the minimum thicknesses of the individual layers. The maximum overall thickness is limited by the penetration of any components added during the thermal treatment that are necessary for conversion of precursor combinations into superconductor phases. The practical range of overall deposit thickness is from about 0.05 micron to about 100 micron. The preferred range is from about 0.5 micron to about 50 micron. Sequences of thin layers may be repeated to achieve a desired thickness, as is illustrated on FIG. 2.

The selection of initial and outer layers is sometimes important to preserving the stoichiometry of the superconductor precursor, even though specific ordering of the superconductor constituents is generally not critical since they interdiffuse during the thermal treatment. The initial layer is selected for its inertness to the substrate. As such, it is not depleted through reaction with the substrate, and it acts as a barrier between reactive inner layers and the substrate. Similarly, the outer layer is selected for its low volatility and low reactivity with the atmosphere. As such, it is not depleted through evaporation or parasitic reaction, and it can act as a barrier between the atmosphere and underlying volatile or reactive layers. These barrier layers may be superconductor constituents, or they may be other materials having barrier properties. For example, when superconducting Tl-Ba-Ca-Cu-oxide is prepared on a MgO substrate, the first layer should be Ba or a specific barrier layer, such as Ni, which is unreactive with MgO; all Tl-, Ba-, and Ca- containing layers should be internal, because Tl and its oxides are volatile at elevated temperatures, and because Ba and Ca react with carbon dioxide to form carbonates. As a further sequencing consideration, juxtaposition should be avoided for layers which can combine to form highly stable non-superconductive compounds.

In the invention process, the particulate matter (herein sometimes also referred to as "particles") and the superconductor metal constituents combine in the electrochemical deposition step (in Bulk Deposition) or steps (in Sequential Deposition) to form a precursor mixture which can be converted into a high temperature superconducting film. The constituents of the final superconductor film, (except those which are or may be supplied during thermal treatment, such as oxygen and fluorine) arise from any of a variety of combinations of particles and matrix metals. For example, all constituents may be provided by the matrix metals and also by the particles; constituents of one superconductor may be provided by the matrix and those of another by the particles; less than all constituents may be provided by the matrix as long as the remaining constituents are provided by the particles.

Particles that are useful in this process include: (1) superconductor phases, (2) superconductor precursor oxides, (3) mixtures of starting materials used in bulk superconductor synthesis, e.g., oxides of Pb, Bi, Ca, Sr, and Cu, (4) mixtures of precursor metals, (5) alloys or mixtures of alloys of precursor metals, and (6) additives that impart a desired property, e.g., normal conductivity and mechanical strength, chemical stability, and improved connectivity at superconductor grain boundaries. Particles are, in general, non-reactive toward the electrolyte salts and solvent, although limited reactivity with electrolyte cations may be tolerated so long as the stoichiometry of particle component and matrix metal is not disrupted. They may be conductive or nonconductive as long as the matrix metals impart overall conductivity to the cathode. Partial mixtures of particulate precursor metals, alloys, and starting materials may be used provided the remaining constituents are supplied through electrodeposition of precursor metals from electrolyte(s). Additives may be the sole particulate material if all of the superconductor constituents are deposited from the electrolyte(s). Complete mixtures or prepared superconductor particles (with or without additives) are preferred.

In general, particles should be fine in order to promote mixing with the electrodeposited component. The particle size may range up to about 50 microns in diameter. The preferred range is from about 0.5 micron to about 10 micron. Particles having a flat or elongated shape are preferred for purposes of orientation.

Useful particle species which are supplied from the electrolyte solution for embedment in the electrochemically deposited metal include (1) particles that supply a constituent metal component for the desired superconductor, (2) particles that supply any other required constituent for the desired superconductor, e.g., oxygen; (3) superconductor particles which may be the same or different from the superconductor to be formed from the electrochemically deposited metal layer and (4) additives imparting a desired property. Superconductor particles which are similar or identical to the superconductor to be formed from the electrochemically deposited metal are generally preferred, since the entire superconductor component is stable within a single range of thermal treatments and not subject to harmful interparticle reactions. Different or dissimilar superconductor particles may be preferred in some cases, e.g., particles of fusable $(Pb)Bi_2Sr_2CaCu_2O_8$ may be embedded in a matrix 5 leading to $YBa_2Cu_3O_x$, or particles of chemically labile Tl-containing superconductors may be encapsulated in a more robust matrix of either Ba-Y-Cu-O type superconductors or of a superconductor from the Bi-family.

As previously stated, the particles which are embedded in the constituent metal(s) in the electrochemical deposition step(s) may furnish one or more of the constituent metals of the desired superconductor. To that end, the particles are used in the form of metal oxides, or of inert metal salt (inert with respect to the components of the electrolyte wherein they will be suspended) and reactable to yield the oxide form in the final thermal treatment step. Exemplary compounds are of the form $M^{+n}X^{-y}_{n/y}$ where $M^{+n}$ is a constituent metal cation, e.g., $Y^{+3}$, $Bi^{+3}$, $Tl^{+3}$, $Eu^{+3}$, $Er^{+3}$, $Yb^{+3}$, $Nd^{+3}$, $La^{+3}$, $Ce^{+4}$, $Th^{+4}$, $Pb^{+4}$, $Pb^{+2}$, $Ca^{+2}$, $Sr^{+2}$, $Ba^{+2}$, $Cu^{+2}$, $Tl^{+1}$, and $K^{+1}$, and $X^{-y}$ is an anion, e.g., $O^{-2}$, $O_2^{-2}$, $O_2^{-}$, $(OH)^{-}$, $(CO_3)^{-2}$, $(NO_3)^{-}$, and $F^{-}$. Mixed compounds which may also be used include $CaCuO_2$, $SrCuO_2$, $Tl_2SrCuO_5$, and the like. Preferred among these are oxides, hydroxides, and carbonates of constituent metals of ceramic superconductors having the highest Tc (critical temperature) and Jc (critical current density) values. Most preferred among these are $Tl_2O_3$, $BaO$, $BaCO_3$, $CaO$, $CaCO_3$, $CuO$, $Bi_2O_3$, $SrO$, $SrCO_3$, $PbO_2$, $Y_2O_3$, and $Eu_2O_3$.

Further, components which are not constituents of superconductor phases may be embedded during the electrochemical deposition in order to impart desired characteristics to the resulting superconducting film. Such additive components may provide a normal-state conductor phase, intergranular junctions, low resistivity contacts, limited flexibility, mechanical stability, chemical stability, enhanced crystallite growth, and density control. Additive components may be deposited in particulate form or, for some applications, as electrochemically deposited metals.

Components that may be added include silver and other noble metals (in the form of particles, filaments, or electrochemically deposited metals), metal filaments coated with silver or other noble metals, high strength ceramic fibers, ceramics useful for epitaxy, and glass spheres.

Silver is particularly versatile because it has no adverse effects on known ceramic superconductor phases and remains metallic and ductile after thermal treatment. It permits rapid oxygen diffusion at high temperatures, thereby facilitating oxidation of Ag-enclosed superconductor precursor materials, while blocking penetration of gaseous reactants (e.g., water and $CO_2$) at room temperature. Powdered Ag (20 weight%) mixed with powdered Bi-Sr-Ca-Cu-O can form a continuous metallic phase interwoven with a continuous superconductor phase. Silver may form intergranular junctions in polycrystalline Y-Ba-Cu-O which facilitate superconductivity. Very low resistance contacts can be formed by annealing Ag-coated Y-Ba-Cu-O. Enhanced flexibility has been observed in sintered tapes of Y-Ba-Cu-O containing Ag powder.

Other noble metals, e.g., Pt, Re, Rh, Ru, Pd, and Au, may offer many of the same advantages of silver to selected superconductor compositions. For example, Au powder (50 weight%) mixed with Y, Ba, and Cu yields an article having both metal and superconductor as continuous, interwoven phases. However, noble metal powders were observed to depress the Tc of Bi-Sr-Ca-Cu-O.

Other additive components that may be useful for imparting dimensional stability and strength include high strength ceramic fibers (e.g., silicon carbide, boron, boron carbide, tungsten nitride, boron nitride). Reinforcing fibers may be particularly important for high magnetic field applications. Fine metal filaments (of Ag, noble metals, or other metals coated with Ag or noble metals) may also impart dimensional stability and strength as well as normal-state conductivity. Ceramic particles providing surfaces for epitaxy (e.g., $LaGaO_3$, $SrTiO_3$, and $Al_2O_3$) may be useful for enhancing crystallite growth. Glass spheres may be useful for controlling density.

The particles are embedded in the electrochemically deposited constituent metal(s) by suspending them in finely divided form (particle size less than about 50 um, preferably less than about 10 um, more preferably less than about 1 um) in the electrolyte, and conducting the electrochemical deposition from that suspension. High aspect ratio (in excess of about 1:10) particles or filaments (of length less than about 2000 um, preferably less than about 100 um, and most preferably less than about 100 um) can be similarly deposited. The particle loading in the electrolyte is dictated by the desired loading in the deposited precursor films. The particle loading in the films may be high in order to take advantage of the composition and phase control afforded by the particles. But it should not exceed the amount that can be held together as a cohesive film by the electrochemically deposited metal matrix. For example, a 90% loading (by volume) of $Bi_2Sr_2CaCu_2O_8$ particles in a matrix of electrochemically deposited Bi-Pb-Sr-Ca-Cu forms a cohesive film which, in turn, yields a nearly phase-pure, highly oriented superconducting film. Desirable particle loadings in the electrolyte (by volume) range from about 1 to about 75%, preferably about 5 to about 50%, with about 10 to about 30 percent being most preferred. Under the above-described electrochemical deposition conditions the particulate matter is driven to the surface of the cathode substrate by (1) the force of the electric field upon charged species absorbed onto the particles, (2) agitation or flow of the electrolyte, or (3) sedimentation induced by gravity or centrifugal motion.

The force of an electric field upon particles having a net charge due to the absorption of dissolved charged species is the basis of electrophoresis. Particles of $YBa_2Cu_3O_{7-x}$ take on a net positive charge when added to an acetone solution of iodine, whereby they can be deposited on a cathode by the application of 100 to 700 V across the cell. Particles of ZnS:Ag assume a positive charge when suspended in $5 \times 10^{-4}$ M solutions of $Mg(NO_3)_2$ and $La(NO_3)_3$ in isopropanol. Other ceramic oxides, including superconductors and their starting materials take on a net positive charge when suspended in solution as herein contemplated.

Inclusions of oxidized constituents may be formed in situ by reaction of electrochemically deposited metals with oxidants dissolved in the electrolyte. Such oxidants include water, $O_2$, $H_2O_2$, $N_2O$, $N(alkyl)_4ClO_4$, $TeCl_4$, $AsF_5$, $(NH_4)S_2O_8$, and the like. Preferred oxidants include those that oxidize some but not all of the deposited metals. Most preferred oxidants include water, $O_2$, $H_2O_2$, and $N_2O$. The concentration of the oxidant in the electrolyte may range from 0.001 M to 1 M, preferably from 0.01 to 0.5 M, and most preferably from 0.05 to about 0.1 M. Deposition conditions are the same as those described above for Bulk Deposition and Sequential Deposition.

Once it is confirmed by conventional analytical methods that the electrochemically deposited layer with the embedded particles contains the constituent metals in the desired proportions, the substrate with the deposited layer is then heated in an oxidizing environment, usually an oxidizing atmosphere, up to a temperature and for a time sufficient to oxidize the deposited metals into the superconducting ceramic state. Either prior to or following this oxidation step, it is sometimes desirable to utilize other thermal or chemical treatments known in the art in order to enhance the properties of the superconductor. For example, melting and resolidification of the as-formed superconductor can be employed to provide enhanced critical currents via enhanced preferential alignment of crystallite grains in the superconductor. In the case of Sequential Deposition, the thermal treatment also effects interdiffusion of the metal layers, and oxidation into the desired superconducting ceramic. Thermal treatment to effect interdiffusion may be carried out in the absence of oxygen; thermal treatment to effect oxidation is carried out in an oxidizing environment. If the metal deposit contains components having relatively high vapor pressure at elevated temperature, such as thallium, for example, it will ordinarily be desirable to conduct the thermal treatment in an atmosphere containing vapor of such component in order to maintain the stoichiometry of the metal deposit.

The present process can readily be employed to produce patterned superconducting films. For example, electrical circuits and other objects containing semiconductors, insulators, or conductor elements with superconducting paths may be formed utilizing the present procedure in combination with conventional lithography or in combination with photoinduced enhancement of electrodeposition. Such combinations can be particularly useful in forming parallel arrays of superconducting wires and dots such as those useful as high efficiency transparent shields of electromagnetic radiation. For applications in which high spatial resolution is not required for the superconductor elements of a circuit or array, patterned superconductor films can be formed by electrochemical deposition using patterned counterelectrodes.

Selective area electrochemical deposition of the superconductor precursor alloys can be conveniently accomplished using a modification of the lithography techniques conventionally employed to form circuits of metallic and semiconducting elements. An insulating photoresist is deposited (for example, by solution or gas deposition) on the electrode substrate. A positive photoresist coating on a cathode substrate may be irradiated in selected areas (to make those areas soluble), and developed by solvent treatment to expose conductive cathode in those areas. Alternatively, a negative photoresist coating may be irradiated in selected areas (to make those areas insoluble), and developed to expose cathode surface in non-irradiated areas only. In either case, subsequent electrochemical deposition leads to the formation of superconductor precursor only in areas of the cathode where the insulating layer of photoresist has been removed.

The precursor metal alloy composition or the layered precursor deposit can also be formed in a pattern on an electrode by means of photoinduced enhancement of the electrochemical deposition. For this purpose, the most convenient photon source is a high energy laser which is scanned across the electrode surface to generate the patterned alloy deposition. The mechanism of the photo enhanced electrochemical deposition varies depending upon the selected photon frequency, the electrolyte, and the target electrode surface. For example, relatively low photon fluxes can be used to generate photocarriers in a photoconductor which is present at the electrode surface. The resulting current flow through the photoconductor then generates the patterned alloy deposition. Alternatively, the photon source can provide patterned alloy deposition by selective volume heating of either the electrolyte or the electrode surface, so as to provide increased current flow at points of irradiation. Patterned deposition on a photoconductor surface can also result from patterned exposure to penetrating radiation, such as x-rays. Hence, it is possible to generate a patterned deposition of the superconductor on surface areas which are inaccessible to either visible or ultraviolet radiation.

Photoinduced electrodeposition is a well known procedure. Use of a laser to enhance metal deposition over small areas is a simple means for producing the small metal patterns in electronic circuitry, thereby doing away with need for the overlaid "masks" that are used in fabricating conventional photolithographic circuits. This method employs a finely focused laser beam to heat a small surface area of the electrode whereon the metal is deposited. The heated area of the electrode heats the surrounding electrolyte, thereby raising its ionic conductivity [see, for example, Chem. & Eng. News, Oct. 29, 1979, p. 7, and Appl. Phys. Lett. 35, 651–653, (1979)].

Modification of the photoenhanced electrochemical deposition can be used to conveniently generate parallel superconducting wires having separations comparable with the wavelength of light. The modified approach utilizes the alternating stripes of intense light and near-zero light intensity resulting from the interference of two light beams. This pattern of illumination generates the patterned deposition of superconductor precursor alloy via selected area photoenhancement of current flow. Oxidation of the thereby obtained precursor "wire" deposits can provide the additional advantage of oriented growth of the superconductor as a consequence of the shape anisotropy of the precursor deposit. Such oriented growth is preferred for improving the properties of the superconductor, and specifically for increasing the critical current.

For applications in which high spatial resolution is not required for the patterned formation of superconductor on a substrate, it is possible to utilize a patterned counter electrode or patterned motion of a counter electrode (having dimensions much smaller than the pattern desired on the electroplated electrode). Patterned deposition by means of patterned counterelectrodes is a well known approach to achieve selective deposition. In electrodeposition, the metal ions within the electrolyte move in response to the applied electric field. The process of electrodeposition is largely a field effect and, assuming adequate agitation within the plating bath, the applied electric field varies inversely with the separation between the cathode and anode. Hence, the deposition rate on the cathode is greatest in areas closest to the anode and low or negligible in areas distant from the anode. This field effect makes patterned deposition by use of patterned counterelectrodes possible. Use of a patterned counterelectrode will, of course, not provide as fine a resolution as is obtainable by photoinduced enhancement of electrodeposition.

Patterned electrochemical deposition of the superconductor precursor metal deposit on a transparent electrode substrate, using the above-described methods, permits preparation of an optically transparent superconductor. The patterning, such as an array of parallel strips or a two-dimensional dot array of either the superconducting or the superconductor-free areas, provides for optical transparency. Such transparent films can find applications as windows which have high efficiency for the shielding of radio frequency and microwave frequency radiation. Use of a two-dimensional dot array of superconductor can provide for a film which is superconducting in the film thickness direction and insulating in the plane of the film.

Several approaches are useful for obtaining crystallite orientation for the superconductors resulting from the electrochemical deposition process. In a first approach, the deposition process or a subsequent recrystallization or annealing step are utilized to provide crystallite orientation for the precursor metal alloy. Oxidation of this oriented precursor can, in preferred cases, result in an oriented superconductor. In a second approach, crystallite orientation is achieved during the oxidation of the precursor deposit. In a third approach, crystallite orientation is achieved by appropriate treatment of the ceramic film, as by melting followed by solidification, annealing or working. Such melting and resolidification processes are broadly defined to include the growth of oriented-crystallite superconductor by dissolution and resolidification from a molten flux (such as copper oxide, which can be conveniently formed using an excess of copper in the electrodeposition substrate or in the electrodeposited metal mixture). The high temperature annealing or the melting-resolidification (recrystallization) step transforms the deposited superconductor into an oriented crystallite layer. For superconducting oxides which have low stability in the molten state, pulsed laser heating, pulsed resistive heating, or heating using a moving laser beam is preferably employed to melt-recrystallize the superconducting ceramic to obtain preferential crystallite alignment.

The same type of physical processes can be used to obtain crystallite orientation for each of these approaches. In one extreme, a substrate can be used which provides for true epitaxy during either electrodeposition, oxidation, or resolidification processes. By true epitaxy, we refer to a substrate whose two-dimensional space group and axial dimensions match that of the superconductor. However, it is not necessary to go to this extreme in order to obtain crystallite orientation for the superconductor. Several issues are important here. First, the existence of a planar substrate can by itself be sufficient for preferential formation of the superconductor with its most rapid growth direction parallel to the substrate. In addition, any anisotropy in the substrate deposition surface can be reflected in preferential orientation of the rapid growth direction within the substrate plane.

Many of the substrates on which epitaxial growth of the superconductors is possible are insulators. One example is $SrTiO_3$, which has previously been used to obtain (by electron beam evaporation and oxidation) epitaxial growth of $YBa_2CuO_{7-x}$ having a critical current in excess of $10^5$ A/cm$^2$ at 77K (Physical Review Letters 58, 2684–2686, 1987). In order to use such insulating substrates effectively in the present process, two different methods can be employed. In the first method one constituent metal component in the superconductor is applied by conventional methods, such as chemical deposition or evaporation. Using this conductive layer, the electrochemical deposition of the remaining metal components of the superconductor oxide can be conveniently accomplished. Alternatively, substrates for epitaxy which are insulating and photoconducting can be employed if irradiation is used to generate a usable photocurrent.

A further means by which crystallite orientation can be achieved for the superconducting ceramic involves use of parallel grooves on the deposition substrate. Such grooves can inhibit crystal growth in any direction other than parallel to the grooves, so that the rapid crystal growth direction becomes oriented in the direction of the grooves.

Another means of obtaining crystallite orientation involves melting and resolidifying the superconductor at a moving interface, such as in Bridgman, Czochralski, or edge-defined crystal growth. This melting and resolidification can be accomplished using either conventional conduction or convection heating, microwave heating, or laser beam heating, preferably using a $CO_2$ or a Nd:YAG laser.

Electrochemical deposition on conducting fibers or wires such as graphite or copper, followed by oxidation to form the superconducting ceramic, also generally results in preferential orientation of the superconducting ceramic. In this case, the most rapid growth direction for formation of the superconducting oxide is typically oriented parallel to the fiber direction.

Mechanical processing (either prior to oxidation, during oxidation, or following oxidation to form the superconducting ceramic) can also be usefully employed to obtain preferential crystallite orientation or to change preexisting crystallite orientation. Orientation of film or fiber deposits of the precursor metal or the ceramic oxide can involve a uniaxial or biaxial draw step, or mechanical deformation of a film by shearing it between opposed rollers. The Bi-Sr-Ca-Cu-oxide superconductors and related compositions are particularly preferred for such mechanical alignment processes because of the clay-like texture of these compositions. In addition, mechanical drawing of high viscosity molten oxides can be used to provide a crystallite-oriented superconductor, by means analogous to those utilized in polymer processing.

It is often convenient, because of the brittle nature of specific superconducting ceramics, to utilize an intermediate mechanical process between the electrochemical deposition and the oxidation steps, which may involve mechanically forming the substrate, such as wire or sheet, into the shaped form required for application, such as a magnet, transformer, or electrical generator core.

Having generally described the invention, the following examples are intended to be illustrative but not limiting in any manner.

EXAMPLE I

Figure 3:
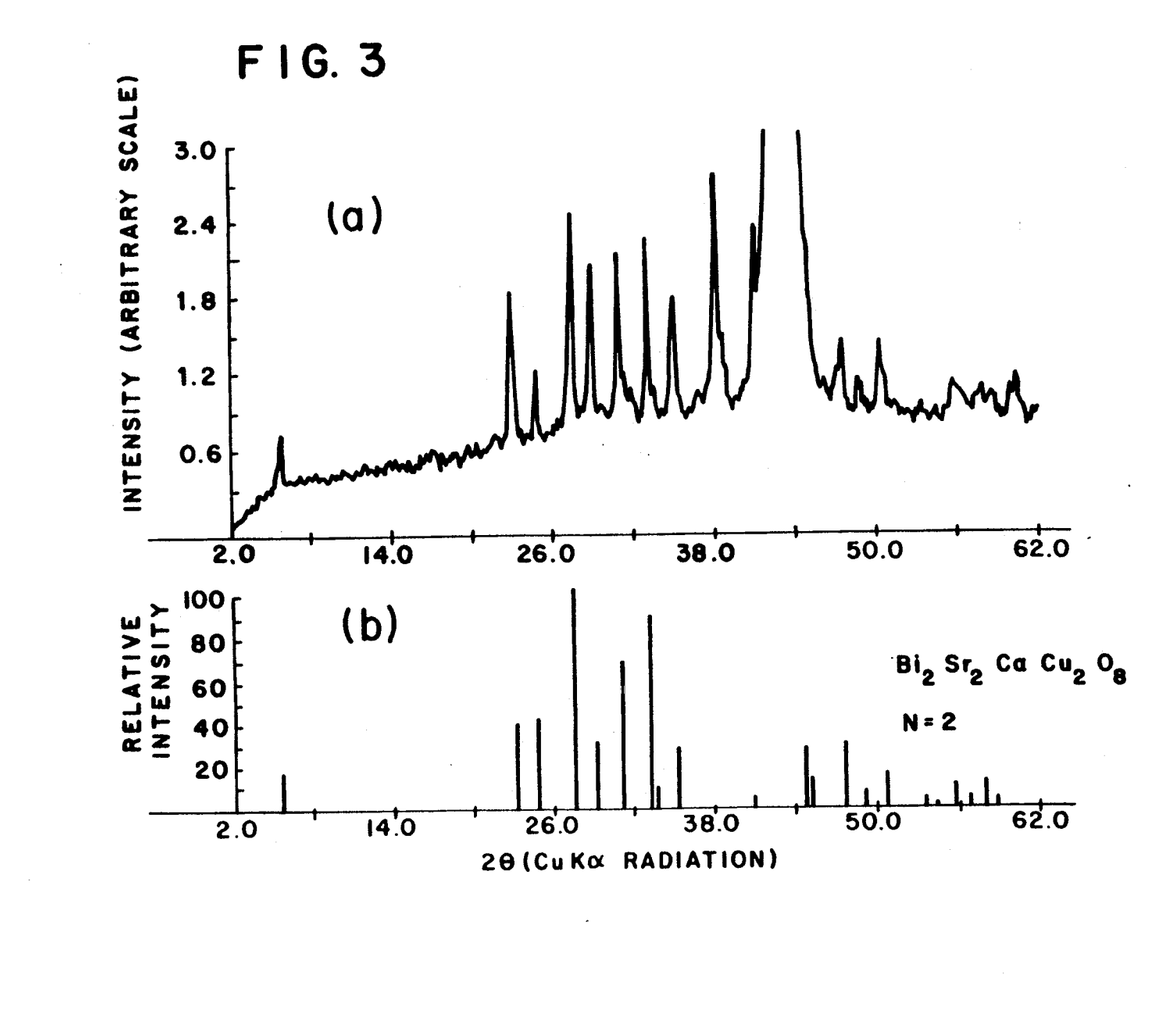
Figure 4:
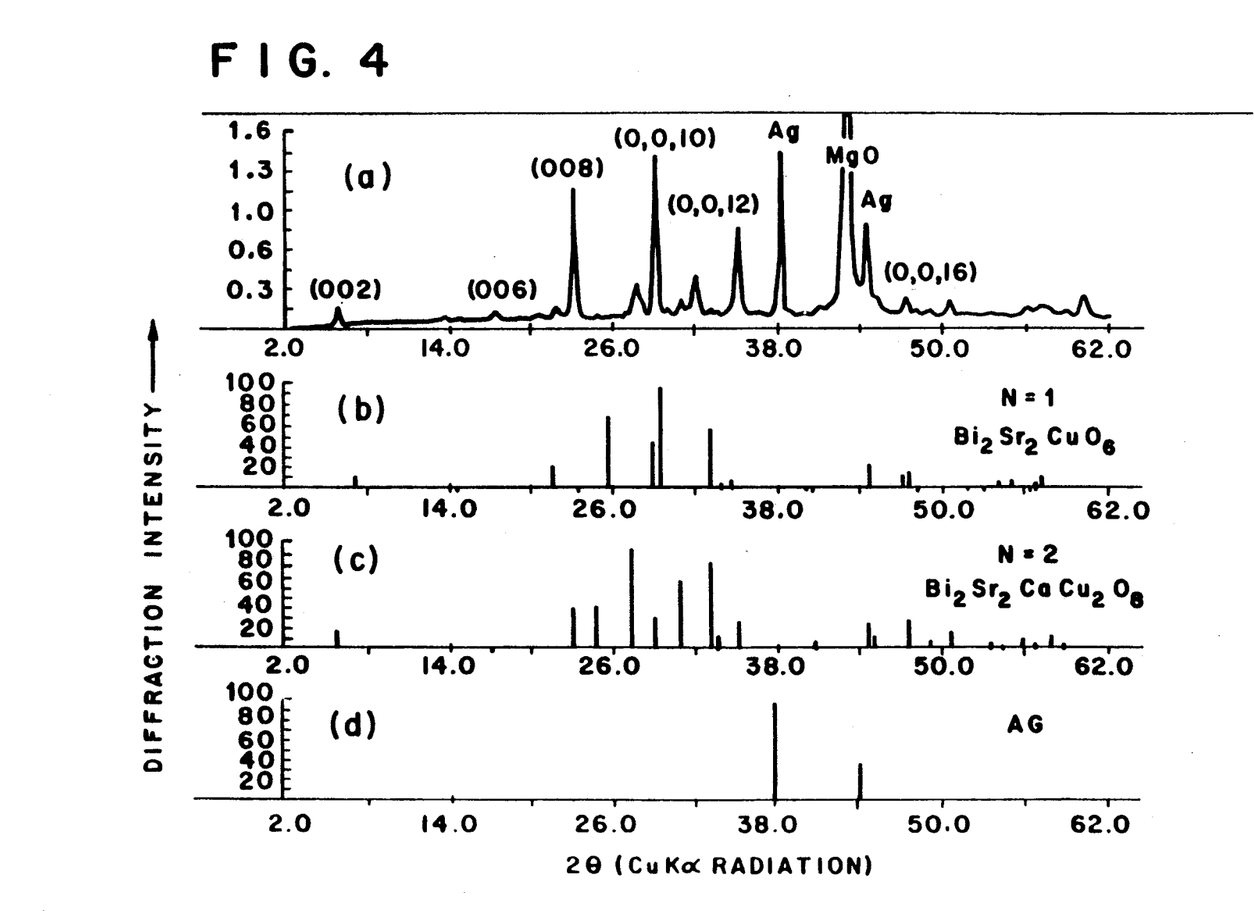
Figure 5:
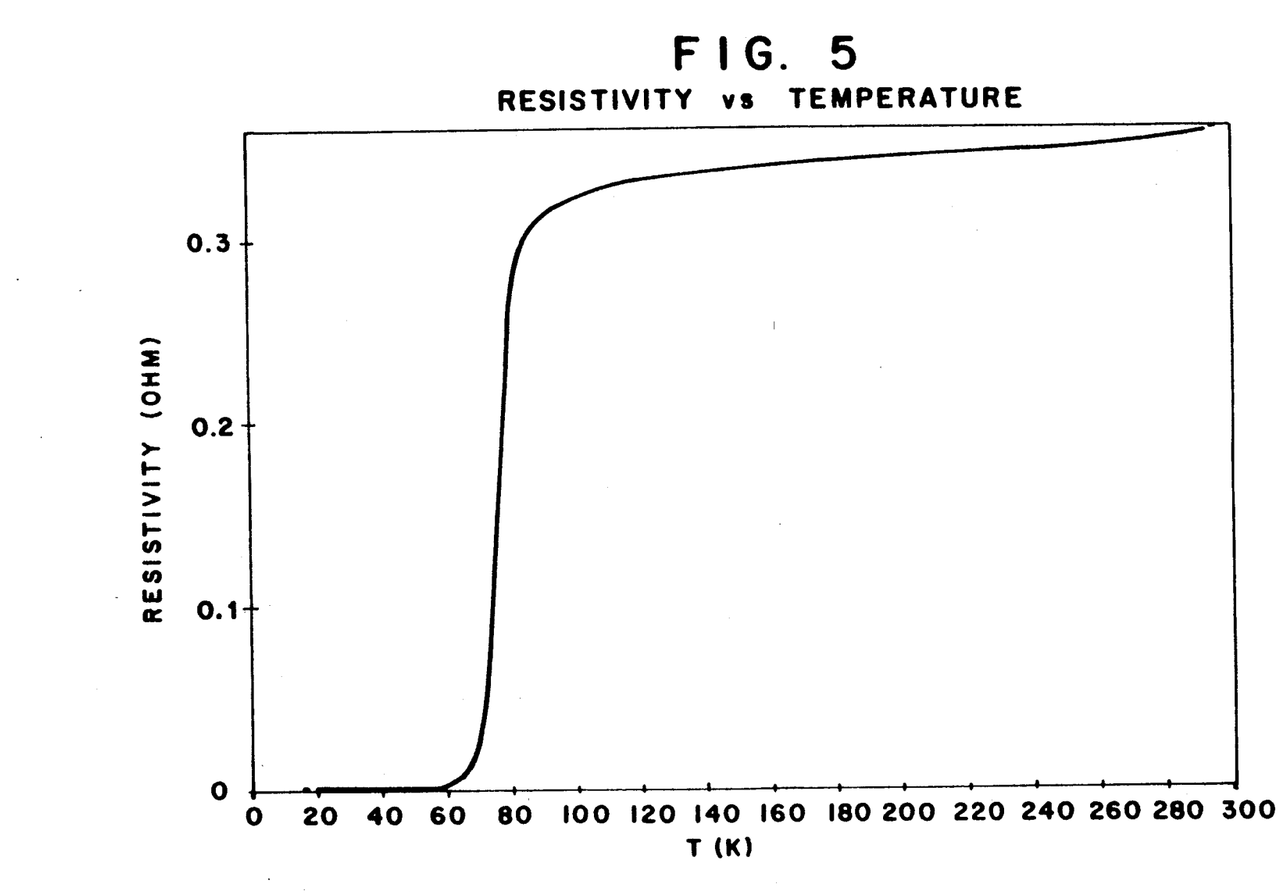
FIG. 5 is a graphical presentation of resistance vs. temperature of the oxidized film of Example I exhibiting zero resistivity at 60 K.

A superconducting film of $(Pb)Bi_2Sr_2CaCu_2O_8$ was formed by thermally oxidizing an electrochemically deposited film of precursor metals, Pb, Bi, Sr, Ca, and Cu plus embedded particles of $Bi_2Sr_2CaCu_2O_8$ (2-2-1-2). The deposited film was formed on a silver-coated MgO substrate cathode by applying $-5$ V (versus a Ag/Ag+ reference electrode) to the substrate cathode while it was immersed in 2 ml of mixed-salt electrolyte containing 20 mg of suspended 2-2-1-2 powder. The mixed salt electrolyte was a dimethyl sulfoxide (DMSO) solution of $NO_2^-$ salts of $Pb^{+2}$, $Bi^{+3}$, $Sr^{+2}$, $Ca^{+2}$, and $Cu^{+2}$ in a molar ratio of 0.2:1:17:3.5:1. After deposition, the film was washed vigorously in fresh DMSO and tetrahydrofuran, and dried. Examination of the film by x-ray diffraction confirmed that unoriented 2-2-1-2 material was incorporated into the film as the dominant crystalline phase (FIG. 3). The film was then heated at 874° C. for 5 min and cooled for 2h to 600° in an atmosphere of argon and oxygen (1:1). The film was re-examined by x-ray diffraction and found to consist of 2-2-1-2 material with an 001 texture (oriented with the c-axis normal to the substrate; FIG. 4). The four-probe resistivity exhibited a metal-superconductor transition at 85 K and exhibited zero resistivity at 60 K (FIG. 5).

EXAMPLE II

Figure 6:
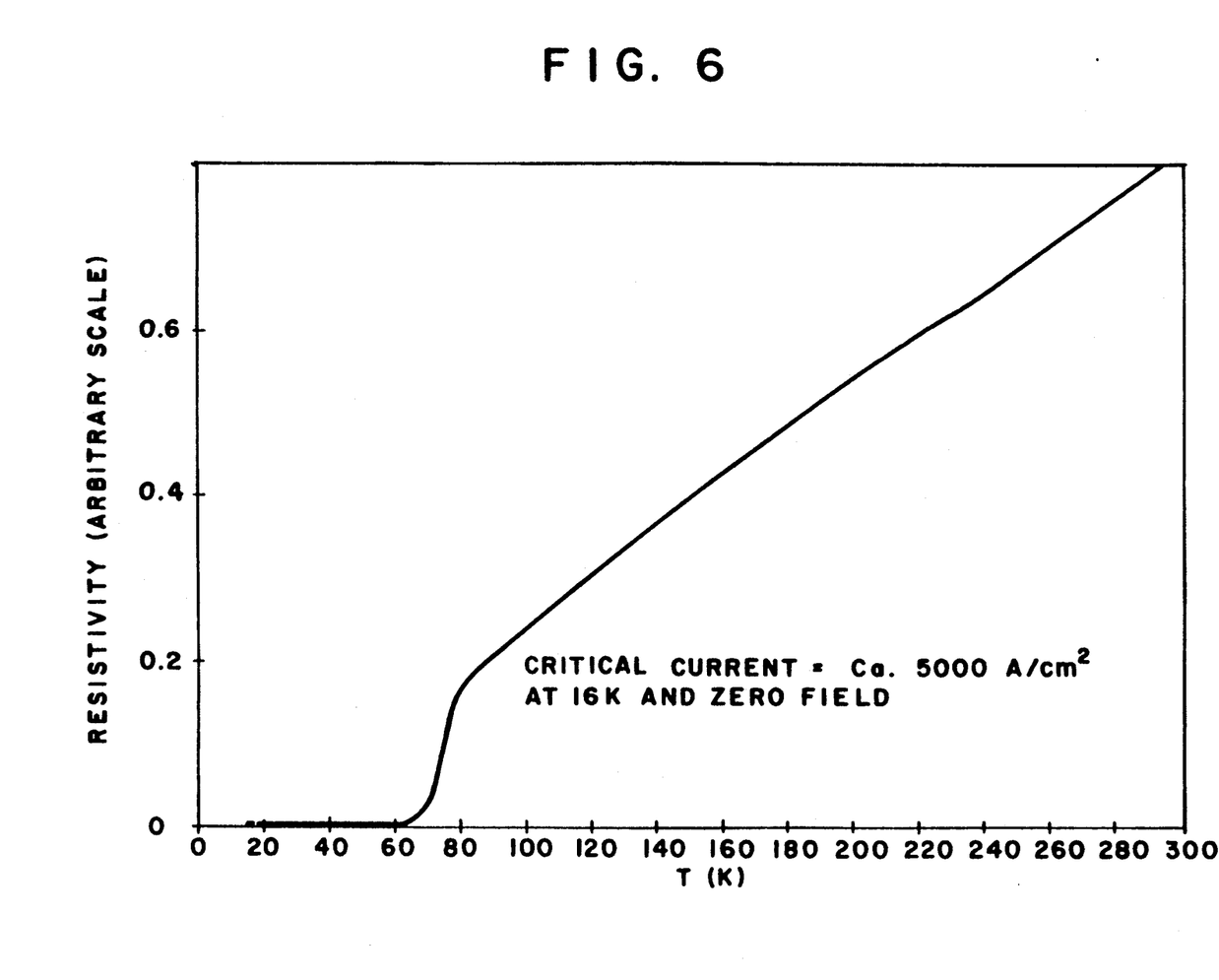
FIG. 6 is a graphical presentation of resistance vs. temperature of the oxidized film of Example II consisting of preformed particles of $Bi_2Sr_2CaCu_2O_8$ and Ag metal particles co-deposited along with electrochemically deposited Bi-Pb-Sr-Ca-Cu.

A superconducting film, having enhanced critical current and enhanced metallic conductivity above the transition temperature, was obtained through thermal oxidation of a precursor film formed by co-deposition of Ag particles, 2-2-1-2 particles during electrochemical deposition of Pb, Bi, Sr, Ca, and Cu precursor metals onto a Ag-coated MgO substrate. The Ag and superconductor particles were combined in a 1:4 ratio by weight and ball milled to a size of less than 20 microns. A 100 mg portion of the combined particles was stirred into 5 ml of the electrolyte described in Example I. A substrate cathode, Pt counter electrode, and Ag reference electrode were immersed in the mixture, and $-5$ V vs. Ag/Ag+ was applied to the substrate cathode. After passage of 3 coulombs/cm² the substrate was agitated vigorously in fresh DMSO and tetrahydrofuran (THF) to remove loose material, heated at 880° C. in $O_2/Ar$ (1:1) for 5 m, and cooled to 600° C. over 2 h. The resulting film consisted of the same superconductor as the film of Example I. But the electrical properties of this film were superior in that (1) its room temperature conductivity was about 10 times higher, (2) its transition to superconductor was sharper, providing zero resistivity by 70 K, and (3) its critical current was increased by at least a factor of 5 (FIG. 6).

EXAMPLE III

Figure 7:
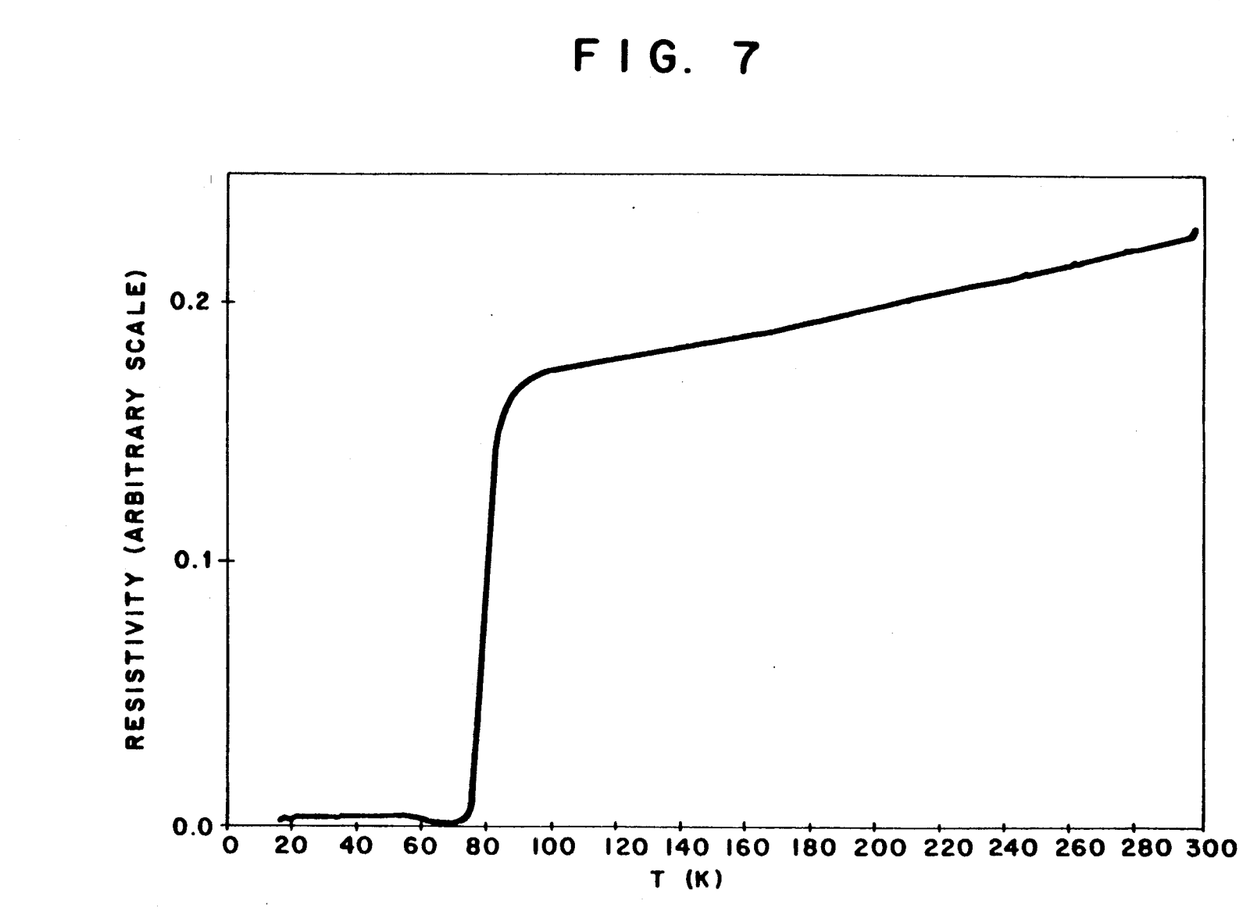
FIG. 7 is a graphical presentation of resistance vs. temperature of the oxidized film of Example III consisting of particles of $Bi_2O_3$, $PbO_2$, SrO, CaO, and CuO co-deposited with electrochemically deposited metals Bi-Pb-Sr-Ca-Cu.

A superconducting film was formed from a precursor film prepared by electrodeposition of the precursor metals: Pb, Bi, Sr, Ca, and Cu along with the embedment of the starting material oxides: $PbO_2$, $Bi_2O_3$, SrO, CaO, and CuO, all in powder form. The oxides were combined in a ratio of 0.5:2:2:1:2 and ball milled together. A 100 mg portion of the mixed powders was stirred into 10 ml of the electrolyte described in Example I. An Ag-coated MgO substrate cathode, Pt counter electrode, and a Ag reference electrode were immersed in the powder/electrolyte mixture, and $-5$ V vs. Ag-/Ag+ was applied to the cathode substrate. After passage of 1.4 coulombs/cm², the substrate was washed vigorously in DMSO and THF, heated at 872° C. for 15 m in an of $O_2/Ar$ (1:9), and cooled to 400° C. over 3 h. The resulting film had a smooth, glassy appearance, was shown by x-ray diffraction to consist of highly textured $n=2$ superconductor phase, and exhibited a metal-superconductor transition that onset at 85 K and went to zero resistivity at 73 K (FIG. 7).

EXAMPLE IV

A precursor film of Y-Ba-Cu, electrochemically deposited from an electrolyte containing about 0.1 M water, was found to contain inclusion of oxides and/or hydroxides. Semiquantitative analysis of the film for Y, Ba, Cu and O indicated that the amount of oxygen was sufficient to form $Y_2O_3$ and $Ba(OH)_2$ from all of the Y and Ba present. The precursor film was electrochemically deposited from a DMSO solution of the following salts:

| salt | conc. | molar metal ratio |
|---|---|---|
| $Y(NO_3)_3$—1.7$H_2O$ | 0.1M | 1 |
| $Ba(NO_3)_2$ | 0.1 | 2 |
| $Cu(OCOCH_3)_2$—$H_2O$ | 0.05 | 0.5 |

Thermal treatment of an identical film yielded a ceramic film whose x-ray diffraction pattern was consistent with $YBa_3Cu_2O_x$ and CuO.

EXAMPLE V

A ceramic film consisting primarily of the $EuBa_2Cu_3O_{7-x}$ superconducting phase was formed by thermal oxidation of a Eu-Ba-Cu precursor deposited as in Example IV from an electrolyte containing a 0.3 M concentration of water. The electrolyte was a 0.2 M solution of salts dissolved in DMSO in the proportions:

| | |
|---|---|
| $Eu(NO_3)_3$—6$H_2O$ | 1.00 part |
| $Ba(NO_3)_2$ | 2.74 |
| $Cu(OCOCH_3)_2$—$H_2O$ | 0.51 |

The deposited precursor film was heated at 900° C. in $O_2$ for 30 min and cooled rapidly. The resulting ceramic exhibited the XRD pattern characteristic of $EuBa_2Cu_3O_{7-x}$ and exhibited magnetic flux exclusion at 60 K.

EXAMPLE VI

A film comprised, principally, of $Bi_2Sr_2CaCu_2O_8$ was formed by thermally oxidizing a Precursor film formed from an electrolyte containing water. The x-ray diffraction (XRD) pattern of a similar precursor exhibited that pattern characteristic of $Sr(OH)_2$.

The precursor films were formed on Ag-coated MgO substrates by electrochemical deposition from a dimethylsulfoxide electrolyte containing nitrate salts of the precursor metals (Bi - 1; Sr - 15; Ca - 3; Cu - 0.5) and about 1 M concentration of water. One precursor film was heated to 880° C. for 5 min in $O_2/Ar$ (1:9) and cooled rapidly. The oxidized film exhibited an XRD pattern consistent with $Bi_2Sr_2CaCu_2O_8$ along with $Bi_2Sr_2CuO_6$ and CuO as minor phases.

COMPARATIVE TEST TO EXAMPLE VI

A precursor film of Bi-Sr-Ca-Cu was found to have no crystalline oxide phases when formed in the absence of water, oxygen, or other oxidizing species. The film was formed as described in Example VI, except that the electrolyte had been rigorously dehydrated by exhaustive evacuation through a trap containing a drying agent, such as $P_2O_5$, and that the deposition was performed in pure argon atmosphere.

EXAMPLE VII

A superconductor film is formed from a precursor film prepared by electrochemical deposition of Cu from an aqueous electrolyte, along with the embedment of $Tl_2O_3$, $BaCO_3$, CaO, and CuO particles suspended in the electrolyte. Powders of the oxides are ground together into the molar ratio 1:2:2:3, respectively, pressed into pellets, re-ground, and dried in vacuum at 110° C. A 200 mg portion of the mixed powders is stirred into 10 ml of electrolyte, comprised of CuCN (75 gram/liter), NaCN (93 g/l), NaOH (30 g/l), and $KNaC_4H_4O_6$-$4H_2O$ (45 g/l). A Ni foil cathode substrate and a Pt counter electrode are immersed in the electrolyte, and a constant current of $-20 mA/cm^2$ is applied to the cathode. The resulting film is rinsed in THF, dried, wrapped tightly in Au foil, and heated at 910° C. for 2 min in $O_2$.

EXAMPLE VIII

A superconducting film consisting of $Pb_{0.4}Bi_{1.6}Sr_2Ca_2Cu_3O_{10}$ and various phases of Tl-Pb-Sr-Ca-Cu-O is formed by electrochemical co-deposition of Tl, Pb, Sr, Ca, and Cu from a DMSO electrolyte containing suspended particles of preformed $Pb_{0.4}Bi_{1.6}Sr_2Ca_2Cu_3O_{10}$. The precursor film is formed as described in Example I except that the electrolyte consists of nitrate salts of $Tl^{+1}$, $Sr^{+2}$, $Pb^{+2}$, $Ca^{+2}$, and $Cu^{+2}$ in a molar ratio of 1:0.4:15:5:2. The precursor film is first heated at 500° C. in $O_2$ for 2 min, and then sealed in Au foil and heated at 860° C. for 10 min in $O_2$ and quenched. The resulting ceramic film consists primarily of Bi n=3 phase in a matrix of Tl n=2 and/or n=3 phases.

EXAMPLE IX

A superconducting film is formed from a precursor film prepared by electrochemical co-deposition of Pb, Bi, Sr, Ca, and Cu along with the embedment of particles of $Sr_2Ca_3Ca$ and $Bi_2Ca$ alloys. The frangible alloys are ground together in a 1:1 molar ratio, pressed into pellets, and re-ground under argon. A 100 mg portion of the mixed alloys is stirred into the electrolyte, embedded during electrolysis, and oxidized as described in Example I.

EXAMPLE X

A patterned superconducting film is formed from a precursor prepared by electrochemically depositing Tl, Pb, Sr, Ca, and Cu along with embedment of particles of $(Pb,Tl)_2Sr_2Ca_2Ca_3O_{10}$ onto a substrate having patterned traces of Cu. A pattern of Cu metal traces are formed on a $LaAlO_3$ substrate by conventional lift-off technology. A 100 mg portion of preformed $(Pb,Tl)_2Sr_2Ca_2Ca_3O_{10}$ is suspended in the electrolyte of Example IX. The patterned substrate cathode is immersed, along with Ag/Ag+ reference and Pt counter electrodes. Application of $-5$ V vs. Ag/Ag+ to the cathode causes electrochemical co-deposition plus embedment of the particles on the Cu traces. The resulting patterned precursor is oxidized and annealed as described in Example IX.

EXAMPLE XI

A reinforced superconducting film is formed from a precursor prepared in a rotating barrel cell. A Ni foil substrate cathode is attached to the internal surface of a cylindrical barrel cell and a counter electrode is located about the axis of the cylinder. The barrel cell is charged with the electrolyte/particle mixture of Example I along with filaments of Ag-coated Ni. The barrel cell is rotated about its axis such that the filaments are mixed evenly with the ceramic particles and driven against the substrate cathode by centrifugal force. The resulting precursor film is heated as described in Example I.

EXAMPLE XII

A superconducting film is formed from a precursor film prepared by sequential deposition of Tl, Ba, Ca, and Cu wherein particles of $Tl_2Ba_2Ca_2Cu_3O_{10}$ are embedded in the deposit during the electrochemical deposition of Tl. Four separate electrolytes are prepared, each consisting of a 0.2 M solution of the nitrate salt of one of the metals in DMSO. The $Tl(NO_3)$ solution additionally includes suspended particles of $Tl_2Ba_2Ca_2Cu_3O_{10}$ (200 mg per 10 ml of solution). A constant current of 5 mA/cm² is applied to the substrate cathode when it is immersed in one electrolyte after the other. The sequence of metals deposited and the amount of charge passed are as follows:

| metal | coul./cm² | molar ratio of metals |
| --- | --- | --- |
| Tl (+ particles) | 0.3 | Tl . . . 3 |
| Ba | 0.1 | Ba . . . 2 |
| Cu | 0.15 | Ca . . . 2 |
| Ca | 0.2 | Cu . . . 3.5 |
| Cu | 0.15 | |
| Ba | 0.1 | |
| Tl (+ particles) | 0.3 | |
| Ba | 0.1 | |
| Cu | 0.15 | |
| Ca | 0.2 | |
| Cu | 0.15 | |
| Ba | 0.1 | |
| Cu | 0.1 | |

The precursor film is heated at 500° C. for 2 min in $O_2$, sealed in Au foil, and reheated at 910° C. for 10 min in $O_2$.

EXAMPLE XIII

A superconducting film comprised of oriented crystallites is formed from a precursor prepared by the electrochemical deposition of Pb, Bi, Sr, Ca, and Cu, along with embedment of $Pb_{0.4}Bi_{1.6}Sr_2Ca_2Cu_3O_{10}$ particles, onto a grooved substrate. A grooved MgO substrate, prepared by selective area etching of 20 micron wide parallel grooves, is coated with Ag metal and immersed in the electrolyte of Example I. A 200 mg portion of $Pb_{0.4}Bi_{1.6}Sr_2Ca_2Cu_3O_{10}$ particles, of particle size less than 5 micron, is stirred into the electrolyte, and $-5$ V vs. Ag/Ag+ is applied to the grooved substrate cathode. The resulting precursor film is rinsed, dried, and heated as described in Example I.

EXAMPLE XIV

A superconducting film is formed from a precursor prepared by the electrochemical deposition of Pb, Bi, Sr, Ca, and Cu along with the embedment of AgO particles. A 50 mg portion of AgO Particles is stirred into 10 ml of the electrolyte of Example I. A Ag-coated MgO substrate cathode is immersed in the electrolyte/particle mixture, and a potential of $-5$ V vs. Ag/Ag+ is applied to it. The resulting precursor film is rinsed, dried, and heated as described in Example I.

Since various changes may be made in the invention without departing from its spirit and essential characteristics, it is intended that all matter contained in the description shall be interpreted as illustrative only and not in a limiting sense, the scope of the invention being defined by the appended claims.

We claim:

1. The method for forming a superconducting ceramic comprising the steps of:
    (a) electrochemically depositing, onto a substrate, at least one of the constituent metals required for forming the superconducting ceramic, and embedding particles of adjuvant matter into the metal as it is being deposited, to form a precursor deposit comprising particulate matter embedded in an electrochemically deposited metal matrix, wherein the constituent metals required for forming the superconducting ceramic are provided, in proportions sufficient to form the superconducting ceramic, from the electrochemically deposited metal alone or in combination with either one or both of the substrate and particulate matter; and
    (b) oxidizing said precursor deposit under conditions sufficient to result in said superconducting ceramic.

2. The method of claim 1 for forming a superconducting ceramic comprising the steps of:
    (1) forming a precursor deposit by
    (a) electrochemically depositing, onto a substrate, at least one of the constituent metals of the superconducting ceramic, and
    (b) embedding particulate matter into the metal as it is being electrochemically deposited, said particulate matter being comprised of material selected from the group consisting of:
        (i) components which provide constituent metal for the desired superconducting ceramic, selected from the group consisting of metals, metal oxides, metal alloys and compounds which are thermally reactable to form metal oxides;
        (ii) superconductor ceramics, which may be the same as or different from the superconducting ceramic to be formed; and
        (iii) adjuvant substances selected from the group consisting of metals other than constituent metals of the superconducting ceramic, metal filaments, and reinforcing fibers;
    wherein, if less than all of the metals required for formation of the desired superconducting ceramic are electrochemically deposited, then the remaining constituent metal is supplied by either one or both of said particulate matter and said substrate, and
    wherein said metals are provided in portions sufficient to form the superconducting ceramic; followed by
    (2) heating said precursor deposit under oxidizing conditions sufficient to result in said superconducting ceramic.

3. The method of claim 2 wherein the particulate matter comprises a superconducting ceramic.

4. The method of claim 3 wherein the particulate matter comprising superconducting ceramic is of the same composition as the superconducting ceramic to be formed.

5. The method of claim 3 wherein the particulate matter comprising superconducting ceramic is different from the superconducting ceramic to be formed.

6. The method of claim 2 wherein the particulate matter provides a constituent metal for the superconducting ceramic to be formed.

7. The method of claim 6 wherein the particulate matter is a metal or metal alloy.

8. The method of claim 6 wherein the particulate matter is a metal oxide or compound which is thermally reactable to form a metal oxide.

9. The method of claim 2 further comprising the step of oxidizing components of the electrochemically deposited metal to form particulate matter in situ.

10. The method of claim 2 wherein the electrochemical deposition step employs electrolyte medium selected from the group consisting of aprotic liquids and aqueous media.

11. The method of claim 10 wherein said electrolyte medium is an aprotic liquid.

12. The method of claim 11 wherein said aprotic liquid is comprised of at least one of dimethyl sulfoxide (DMSO), dimethyl formamide (DMF), dimethoxyethane (DME) and tetrahydrofuran (THF).

13. The method of claim 2 wherein the electrochemical deposition step is conducted in such manner that a patterned deposit results, with said oxidation step being conducted on said patterned deposit to result in a patterned superconducting ceramic deposit.

14. The method of claim 1 wherein the patterned deposit is obtained by means of photoinduced enhancement of the electrochemical deposition step by scanning a photon source over the substrate surface to generate a patterned deposit.

15. The method of claim 13 wherein the patterned deposit is obtained by placing a photoresist in patterned manner on the substrate, and thereafter conducting the electrochemical deposition step.

16. The method of claim 2 further comprising the step of orienting the crystallites in the superconducting deposit to thereby obtain an increase in the critical current density of the superconducting ceramic.

17. The method of claim 16 wherein crystallites are oriented by melting and resolidifying the electrochemically deposited metals.

18. The method of claim 16 wherein crystallites are oriented by melting and resolidifying the oxidized superconducting ceramic.

19. The method of claim 18 wherein melting and resolidification takes place in a moving interface between solidified and molten superconducting ceramic.

20. The method of claim 16 wherein crystallites are oriented by mechanically deforming the superconducting ceramic during or following the oxidation step.

21. The method of claim 2 wherein the step of embedding particulate matter in the metal as it is being electrochemically deposited comprises the steps of suspending the particulate matter in the electrolyte employed in the electrochemical deposition, and conducting the electrochemical deposition from the electrolyte containing the suspended particulate matter.

22. The method of claim 21 wherein embedment of the particulate matter is enhanced by subjecting the suspended particulate matter to centrifugal force during the electrochemical deposition process.

23. The method of any one of claims 2, 3, 6, 7, 8, 13, 14, 15, 16, 21 or 22 wherein the electrochemical deposition is conducted from an electrolyte containing at least two of the constituent metals of the superconducting ceramic to be formed, and the electrolyte medium is an aprotic liquid.

24. The method of any one of claims 2, 3, 6, 7, 8, 13, 14, 15, 16, 21 or 22 wherein at least two of the constituent metals of the superconducting ceramic to be formed are sequentially deposited superimposed layers.

* * * * *